(12) United States Patent
Huang et al.

(10) Patent No.: US 12,648,205 B2
(45) Date of Patent: Jun. 2, 2026

(54) SEMICONDUCTOR DEVICE AND METHOD OF FABRICATING THE SAME

(71) Applicant: United Semiconductor (Xiamen) Co., Ltd., Xiamen (CN)

(72) Inventors: Chin-Chun Huang, Hsinchu County (TW); Rong He, Shamen City (CN); Xiang Wang, Shamen City (CN); You-Di Jhang, New Taipei City (TW); Hailong Gu, Singapore (SG); Jinjian Ouyang, Xiamen (CN); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 401 days.

(21) Appl. No.: 18/107,995

(22) Filed: Feb. 9, 2023

(65) Prior Publication Data

US 2024/0222472 A1 Jul. 4, 2024

(30) Foreign Application Priority Data

Jan. 4, 2023 (CN) .......................... 202310007881.9

(51) Int. Cl.
*H10D 64/01* (2025.01)
*H10D 64/27* (2025.01)
*H10D 64/68* (2025.01)

(52) U.S. Cl.
CPC ......... *H10D 64/017* (2025.01); *H10D 64/518* (2025.01); *H10D 64/691* (2025.01)

(58) Field of Classification Search
CPC ... H10D 64/017; H10D 64/691; H10D 64/518
See application file for complete search history.

(56) References Cited

U.S. PATENT DOCUMENTS

| | | | |
|---|---|---|---|
| 6,475,841 B1 * | 11/2002 | Taylor, Jr. .......... | H10D 84/0135 257/E21.624 |
| 9,105,720 B2 | 8/2015 | Lin | |
| 9,245,972 B2 | 1/2016 | Chen | |
| 9,305,847 B2 | 4/2016 | Chen | |
| 9,318,490 B2 | 4/2016 | Tsao | |
| 9,761,690 B2 | 9/2017 | Hsu | |
| 2010/0084720 A1 * | 4/2010 | Oh ........................ | H10D 64/661 438/513 |
| 2018/0254338 A1 * | 9/2018 | Kim ..................... | H10D 30/024 |
| 2022/0367671 A1 * | 11/2022 | Hsiao ................. | H10D 30/0243 |
| 2025/0113530 A1 * | 4/2025 | Nagasato .............. | H10F 39/014 |

* cited by examiner

*Primary Examiner* — Christine A Enad
(74) *Attorney, Agent, or Firm* — Winston Hsu

(57) ABSTRACT

The present invention provides a semiconductor device and a method of fabricating the same, which includes a substrate, a gate structure, and a dielectric layer. The gate structure is disposed on the substrate and includes an inverted trapezoidal shape. The dielectric layer is disposed on the substrate, and the gate structure is disposed within the dielectric layer. The gate structure includes a metal gate structure or a polysilicon gate structure.

19 Claims, 5 Drawing Sheets

150  144  140  138  136

132

100

142

128

124
122

W1

W2

110

300

317

316

314
312

110

SEMICONDUCTOR DEVICE AND METHOD OF FABRICATING THE SAME

BACKGROUND OF THE INVENTION

1. Field of the Invention

The present disclosure relates to a semiconductor device and a method of fabricating the same, and more particularly, to a semiconductor device having an inverted trapezoidal gate structure and a method of fabricating the same.

2. Description of the Prior Art

Poly-silicon is conventionally used as a gate electrode in semiconductor devices, such as the metal-oxide-semiconductor (MOS). With the trend towards scaling down the size of semiconductor devices, however, conventional polysilicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional polysilicon gate to be the control electrode.

Generally, the fabrication methods of the metal gate structure may include a gate first process and a gate last process. According to the gate last process, a sacrificial gate is firstly formed and followed by removing the sacrificial gate to form a gate recess, and finally filling in the gate trench with various work function metal layers required by different conductivity type. Then, a planarization process is performed to form a replacement metal gate. However, while fabricating a complementary metal-oxide semiconductor (CMOS) devices, the work function metal is required to be matched with both of the N-type metal-oxide semiconductor transistor (NMOS) and the P-type metal-oxide semiconductor transistor (PMOS) respectively, which makes the fabrication of the related devices becomes more complicated and the requirements on the filling materials become more stringent.

Thus, it is still a main subject to further improve the related semiconductor device and the fabricating method thereof in order to meet the practical requirements of the industry.

SUMMARY OF THE INVENTION

In light of the above, the present disclosure is directed to provide a semiconductor device and a fabricating method thereof, by adjusting the profile of a polysilicon gate, to form a gate trench with a larger aperture at top and a smaller aperture at bottom, so as to be beneficial on depositing a work function metal layer and/or a conductive layer into the gate trench in the subsequent process. In this way, the semiconductor device of the present disclosure may therefore obtain a gate structure having an inverted trapezoidal shape, so that the voltage may be stably applied thereto, to achieve a more optimized device performance.

According to one embodiment of the present disclosure, a semiconductor device is provided and includes a substrate, a metal gate structure and a dielectric layer. The metal gate structure is disposed on the substrate, with the metal gate structure including an inverted trapezoidal shape. The dielectric layer is disposed on the substrate, wherein the metal gate structure is disposed within the dielectric layer.

According to another embodiment of the present disclosure, a semiconductor device is provided and includes a substrate, a polysilicon gate structure and a dielectric layer. The polysilicon gate structure is disposed on the substrate, wherein the polysilicon gate structure includes a dopant having a concentration gradually increased from top to bottom. The dielectric layer disposed on the substrate, wherein the polysilicon gate structure is disposed within the dielectric layer.

According to another embodiment of the present disclosure, a fabricating method of a semiconductor device is provided and includes the following steps. Firstly, a substrate is provided, and a polysilicon gate structure is formed on the substrate, wherein the polysilicon gate structure includes a dopant having a concentration gradually increased from top to bottom. Next, a dielectric layer is formed on the substrate, wherein the polysilicon gate structure is formed within the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 illustrate schematic diagrams of a fabricating method of a semiconductor device according to a first embodiment of the present disclosure, in which:

FIG. 1 is a schematic cross-sectional view of a semiconductor device after forming a semiconductor material layer;

FIG. 2 is a schematic cross-sectional view of a semiconductor device after performing a patterning process;

FIG. 3 is a schematic cross-sectional view of a semiconductor device after forming a polysilicon gate structure;

FIG. 4 is a schematic cross-sectional view of a semiconductor device after forming a gate trench; and FIG. 5 is a schematic cross-sectional view of a semiconductor device after forming a metal gate structure.

FIG. 6 to FIG. 10 illustrate schematic diagrams of a fabricating method of a semiconductor device according to a second embodiment of the present disclosure, in which:

FIG. 6 is a schematic cross-sectional view of a semiconductor device after forming dopants;

FIG. 7 is a schematic cross-sectional view of a semiconductor device after performing a patterning process;

FIG. 8 is a schematic cross-sectional view of a semiconductor device after forming a polysilicon gate structure;

FIG. 9 is a schematic cross-sectional view of a semiconductor device after forming a gate trench; and FIG. 10 is a schematic cross-sectional view of a semiconductor device after forming a metal gate structure.

DETAILED DESCRIPTION

Figure 1:
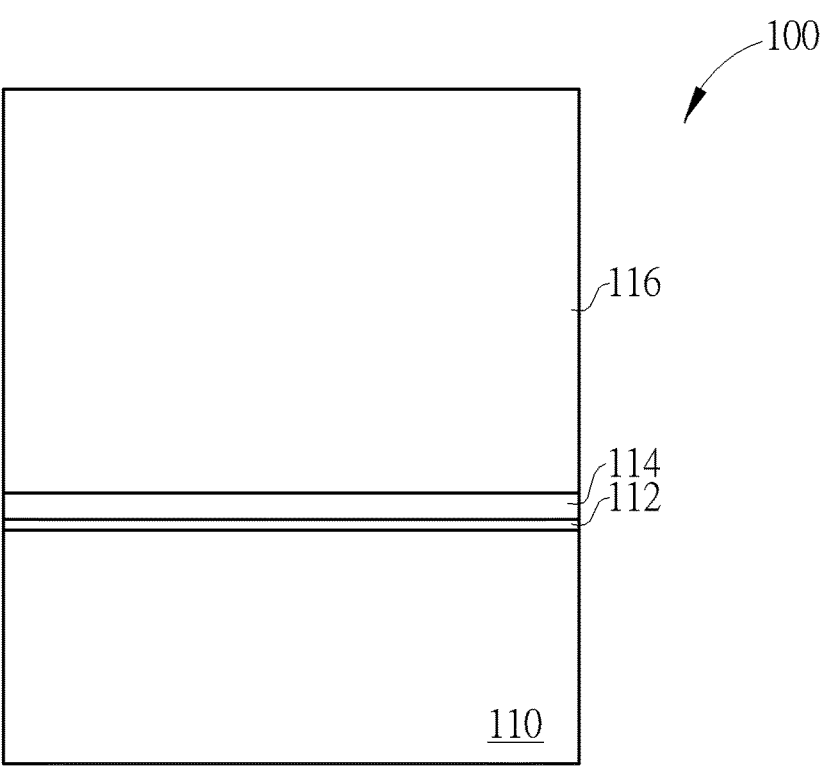

To provide understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Please refer to FIG. 1 to FIG. 5, which are schematic diagrams illustrating the fabricating method of a semiconductor device 100 according to the first embodiment of the present disclosure. Firstly, a substrate 110 is provided, and the substrate 110 for example includes a silicon substrate, an epitaxial silicon substrate, a silicon containing substrate or a silicon-on-insulator (SOI) substrate. Next, a gate structure 130 is formed on the substrate 110. In the present embodiment, a plurality of fin shaped structures (not shown in the drawings) and a shallow trench isolation (not shown in the drawings) may further be formed in the substrate 110, and the gate structure 130 is disposed across at least one of the fin shaped structures, with a transistor to be formed in the subsequent process being a fin field-effect transistor (Fin-FET). Also, in another embodiment, a plurality nanowire structures (not shown in the drawings) may be formed in the substrate, with the transistor to be formed in the subsequent process being a gate all around (GAA). However, if the transistor to be formed in the subsequent process is a planar transistor, the formation of the fin shaped structure or the nanowire structure may also be omitted, and the gate structure 130 is directly formed on a planar substrate (not shown in the drawings). In other words, the gate structure 130 may be applied on the fabrication of any type of the transistor structure.

Precisely speaking, the formation of the gate structure 130 includes but not limited to the following steps. Firstly, as shown in FIG. 1, an interface layer 112, a dielectric layer 114, and a semiconductor layer 116 having undoped polysilicon (USG) or undoped amorphous silicon are sequentially formed on the substrate 110. In one embodiment, the interface layer 112 for example includes an insulating material like silicon oxide ($SiO_2$), but not limited thereto. It is noted that, the dielectric layer 114 of the present embodiment directly includes a high-k dielectric material layer, for example including a dielectric material with a dielectric constant greater than 4, such as a material selected from a group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but not limited thereto.

Figure 2:
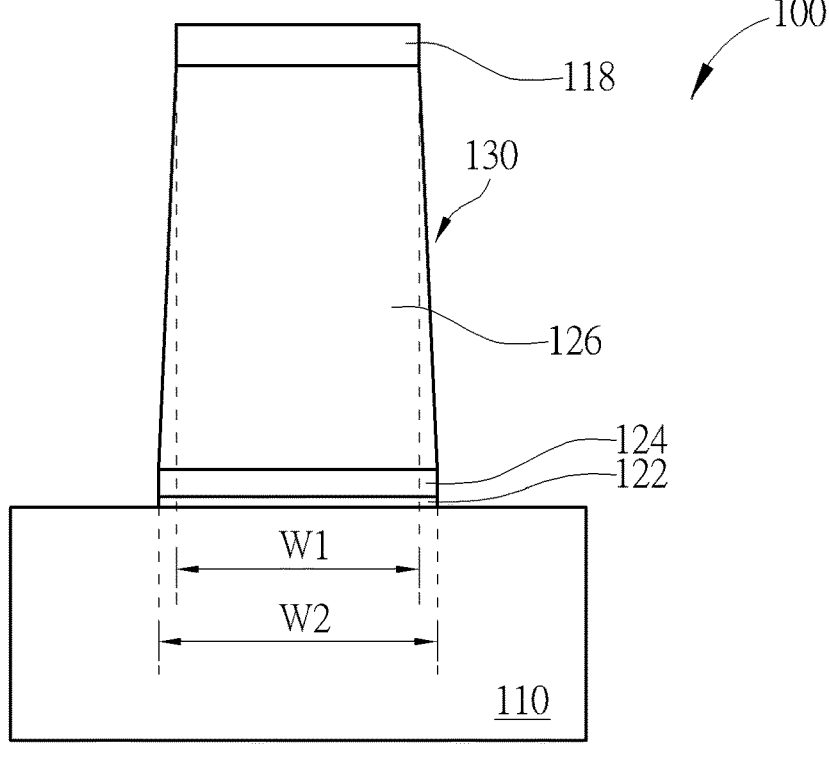

As shown in FIG. 2, a photolithography process is performed through a mask layer 118 formed on the substrate 110, to pattern the semiconductor layer 116, the dielectric layer 114, and the interface layer 112 stacked one over another as shown in FIG. 1. Precisely speaking, through the photolithography process, the patterns of the mask layer 118 are gradually transferred into the semiconductor layer 116, the dielectric layer 114, and the interface layer 112 stacked one over another as shown in FIG. 1, to form an interface layer 122, a gate dielectric layer 124, and a gate electrode layer 126 stacked from bottom to top on the substrate 110, to together form the gate structure 130, namely a polysilicon gate structure or an amorphous silicon gate structure.

It is noted that, while performing an etching process of the photolithography process, the byproducts generated by the reaction between an etchant and the etched semiconductor layer 116 will accumulate on sidewalls of the patterned structure, especially at the middle or the bottom of the sidewalls. Accordingly, the accumulated byproducts become a barrier for blocking the etchant, locally preventing the semiconductor layer 116, the dielectric layer 114 and the interface layer 112 from being etched, so that, the gate structure 130 (especially for the gate electrode layer 126) formed in the subsequent process will gain a cross-sectional profile with a smaller width at top and a larger width at bottom, thereby showing a trapezoidal shape, or a cross-sectional profile with a larger width at top and bottom, and with a smaller width at middle, thereby showing a bottle shape (not shown in the drawing), but not limited thereto. In the present embodiment, due to the local protection by the byproducts during the etching process, the cross-section of the gate structure 130 has a relative smaller width W1 at the top, and a relative larger width W2 at the bottom, thereby substantially showing a trapezoidal shape, as shown in FIG. 2.

Figure 3:
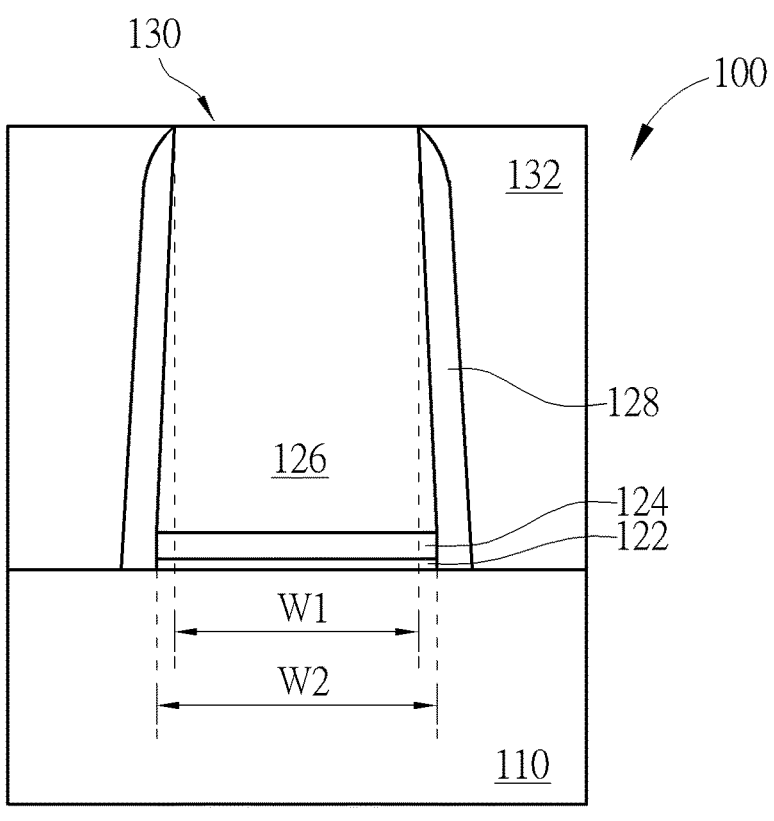

As shown in FIG. 3, after completely removing the mask layer 118, a deposition process and an etching back process are sequentially performed, to form a spacer 128 on sidewalls of the gate structure 130, with the spacer 128 including a monolayer structure or a multilayer structure. In one embodiment, the spacer 128 for example includes a high temperature oxide (HTO), silicon nitride (SiN), silicon oxide, silicon oxynitride (SiON), silicon carbonitride (SiCN) or silicon nitride (HCD-SiN) formed by hexachlorodisilane ($Si_2Cl_6$), but not limited thereto.

Further in view of FIG. 3, an interlayer dielectric (ILD) layer 132 is next formed on the substrate 110, for example including a material like silicon oxide or tetraethyl orthosilicate (TEOS), to cover the spacer 128. Precisely speaking, the formation of the ILD layer 132 is accomplished by firstly forming a dielectric material layer (not shown in the drawings) on the substrate 110, entirely covering the gate structure 130 and the spacer 128, and a planarization process such as a chemical mechanical polishing (CMP) process is performed to partially remove the dielectric material layer to expose the top portion of the gate structure 130, namely exposing the gate electrode layer 126 having polysilicon or amorphous silicon materials. Accordingly, the top surface of the ILD layer 132 is coplanar with the top surface of the gate structure 130. Furthermore, in another embodiment, a contact etching stop layer (CESL, not shown in the drawings) may be optionally formed on the substrate 110, before forming the dielectric material layer, with the CESL for example including a monolayer structure or a multilayer structure, to apply the required compressive stress or the required tensile stress to a channel region (not shown in the drawings) under the gate structure 130, that is, to provide the required compressive stress or the required tensile stress to a P-type metal-oxide transistor (PMOS) or a N-type transistor (NMOS) fabricated in the subsequent process, but not limited thereto.

Figure 4:
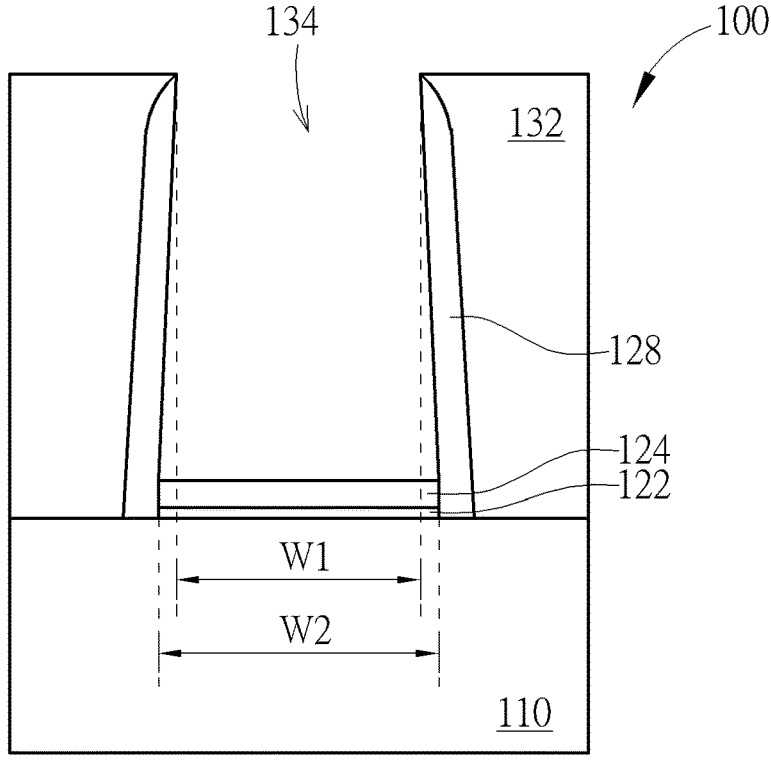

Following these, a replacement metal gate (RMG) process is performed, and the gate structure 130 is replaced by a metal gate structure 150, with the RMG process including but not limited to the following steps. Firstly, as shown in FIG. 4, a selectively dry etching process or a wet etching process is performed, for example removing the gate electrode layer 126 of the gate structure 130 by using an etchant like ammonium hydroxide ($NH_4OH$) or tetramethylammonium hydroxide (TMAH), so that, a gate trench 134 is formed in the ILD layer 132, to expose the dielectric layer 124 underneath. Since the profile of the gate trench 134 is defined by the profile of the gate electrode layer 126 having the polysilicon or the amorphous silicon material, the cross-section of the gate trench 134 correspondingly includes a relative smaller aperture at the top, for example being substantially the same as the width W1 of the gate electrode layer 126 as shown in FIG. 3, and a relative larger aperture at the bottom, for example being substantially the same as the width W2 of the gate electrode layer 126. Thus, the cross-section of the gate trench 134 also shows a trapezoidal shape.

Figures 5, 6:
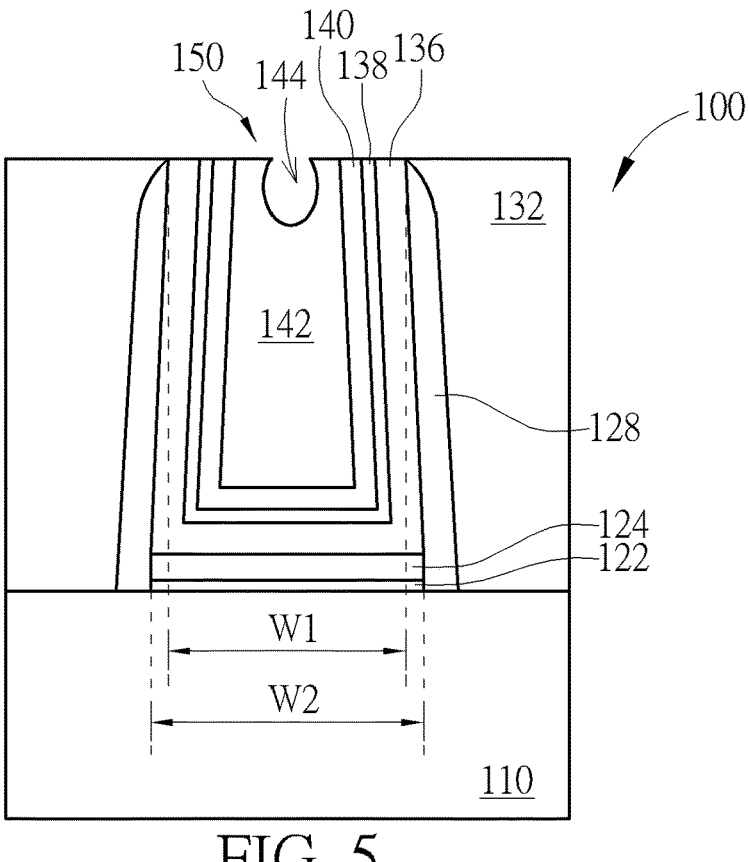

After that, as shown in FIG. 5, a bottom barrier layer 136, a work function metal layer 138, a top barrier layer 140, and a conductive layer 142 are sequentially formed in the gate trench 134 as shown in FIG. 4, to form the metal gate structure 150. Since the metal gate structure 150 is formed within the gate trench 134, the cross-sectional profile of the metal gate structure 150 is also defined by the profile of the gate electrode layer 126, thereby also showing a trapezoidal shape as a whole structure. Then, the cross-section of the metal gate structure 150 also includes a relative smaller width W1 at the top and a relative larger width W2 at the bottom.

Precisely speaking, the formation of the metal gate structure 150 includes but is not limited to the following steps. Firstly, a plurality of deposition processes is performed to sequentially form a bottom barrier material layer (not shown in the drawings), a work function metal material layer (not shown in the drawings), and a top barrier material layer (not shown in the drawings), in the gate trench 134 as shown in FIG. 4 to partially fill in the gate trench 134, and a conductive material layer (not shown in the drawings) is next formed to fill up the rest space of the gate trench 134. Then, a planarization process such as a chemical mechanical polishing process is performed to remove the conductive material layer, the top barrier material layer, the work function metal material layer, and the bottom barrier material layer not filled in the gate trench 134. With these performances, the top surfaces of the bottom barrier layer 136, the work function metal layer 138, the top barrier layer 140 and the conductive layer 142 are therefore coplanar with the top surface of the ILD layer 132, and the bottom barrier layer 136, the work function metal layer 138, and the top barrier layer 140 respectively include an U-shaped cross-section, as shown in FIG. 5.

It is noted that, since the cross-sectional profile of gate trench 134 includes the relative smaller aperture at the top and a relative larger aperture at the bottom (in a trapezoidal shape), and the conductive material layer generally has poor step coverage and poor hole filling, the void, the seam or the like is easily generated while depositing the conductive material layer in the gate trench 134. The aforementioned void or seam may not be sufficiently removed in the subsequent planarization process, and some of them may be remained in the conductive layer 142 to form a void 144 as shown in FIG. 5.

In one embodiment, the bottom barrier layer 136 and the top barrier layer 140 for example include titanium (Ti), titanium nitride (TiN), tantalum (Ta), or tantalum nitride (TaN), and the conductive material layer 142 may include a low resistant metal material like copper (Cu), aluminum (Al), tungsten (W), titanium aluminum alloy (TiAl) or cobalt tungsten phosphide (CoWP), preferably including aluminum, not but limited thereto. Furthermore, in the present embodiment, the work function metal layer 138 is configured to adjust the work function of the metal gate structure 150, so as to be suitable for forming an N-type MOS transistor or a P-type MOS transistor. For example, if the formed transistor is an N-type MOS transistor, the work function metal layer 138 may include a metal material with a work function of 3.9 eV to 4.3 eV, such as including titanium aluminum (TiAl), zirconium aluminide (ZrAl), tungsten aluminide (WAl), tantalum aluminide (TaAl), hafnium aluminide (HfAl) or titanium aluminum carbide (TiAlC), but not limited thereto. On the other hand, if the formed transistor is a P-type MOS transistor, the work function metal layer 138 may include a metal material with a work function of 4.8 eV to 5.2 eV, such as titanium nitride, tantalum nitride or tantalum carbide (TaC), but is not limited thereto.

Through these processes, the fabrication of the semiconductor device 100 according to the first embodiment of the present disclosure is accomplished, and the metal gate structure 150 of the present embodiment is capable of being used on forming a logic element or a high-voltage element (for example a semiconductor device with an operating voltage being higher than 20 volts). People skilled in the arts should fully realized that although the fabricating method of the present embodiment is exemplified by firstly forming a polysilicon gate structure or an amorphous silicon gate structure (namely the gate structure 130), and then forming the metal gate structure 150 through a gate last process and a high-k first process in the subsequent process, the present disclosure is not limited thereto. In another embodiment, the metal gate structure may also be formed through a gate first process and a high-k first process, or through a gate first process and a high-k last process according to the practical product requirements, for example, directly forming a metal gate structure on the substrate, with the metal gate structure at least including a work function metal layer (not shown in the drawings) and a metal gate (not shown in the drawings).

People skilled in the arts should fully understand that the semiconductor device of the present disclosure is not limited to be the aforementioned type, and which may further include other examples or variations based on practical product requirements. For example, in a fabricating method the semiconductor device according to another embodiment, a metal gate structure with a more complete and compact structure may be formed, to improve all the defects of the metal gate such as shrinking conductive area, increasing resistance, insufficient pressurization and unstable currents caused by the void 144 remained in the metal gate structure 150. The following description will detail the different embodiments of the semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 6 to FIG. 10, which are schematic diagrams illustrating the fabricating method of a semiconductor device 300 according to the second embodiment of the present disclosure. In the present embodiment, the fabricating processes of the semiconductor device 300 are substantially the same as those of semiconductor device 100, and all similarity between the present embodiment and the aforementioned embodiment will not be redundantly described hereinafter. The difference between the present embodiment and the aforementioned embodiment is mainly in that forming a polysilicon gate structure or an amorphous silicon gate structure having a dopant 317 with a concentration gradually increased from top to bottom.

Precisely speaking, as shown in FIG. 6, a substrate 110 is provided, an interface layer 312, a dielectric layer 314, and a semiconductor layer 316 including polysilicon or amorphous silicon are sequentially formed on the substrate 110, wherein the detailed features and the materials of the interface layer 312 and the dielectric layer 314 are substantially the same as those of the interface layer 112 and the dielectric layer 114 of the first embodiment, and which will not be redundantly described hereinafter.

It is noted that, while forming the semiconductor layer 316 on the substrate 110, the dopant 317 with the concentration gradually increasing from top to bottom is formed simultaneously, wherein the concentration of the dopant 317 in the semiconductor layer 316 is for example about 1E14 to 1E15 per cubic centimeter. For example, the concentration of the dopant 317 at the top of the semiconductor layer 316 may be about 1E14 per cubic centimeter, and the concentration of the dopant 317 at the bottom of the semiconductor layer 316 may be about 1E15 per cubic centimeter, but not limited to. On the other hand, the dopant 317 for example includes an N-type dopant such as a group V element, like phosphorus (P), arsenic (As), tellurium (Te) or a combination thereof, a P-type dopant such as a group III element like boron (B), aluminum (Al), gallium (Ga) or a combination thereof, or other dopants whose concentration may be adjusted to control the etching rate of the semiconductor layer 316. Preferably, the material selection of the dopant 317 may be different depending on the various conductive types of the transistor formed in the subsequent process. For example, when the dopant 317 includes the N-type dopant, the semiconductor layer 316 is more suitable for fabricating a N-type MOS transistor in the subsequent process, and when the dopant 317 includes the P-type dopant, and the semiconductor layer 316 is more suitable for fabricating a P-type MOS transistor in the subsequent process, but not limited thereto.

In addition, the formation of the dopant 317 is preferably accomplished by simultaneously introducing the dopant gas synchronously through an in-situ doping process, while the semiconductor layer 316 is formed, and the gas flowing rate of the dopant 317 may be further adjusted during the in-situ doping process, so as to control the doping concentration of the dopant 317 in the semiconductor layer 316. Preferably, while firstly depositing polysilicon or amorphous silicon, the dopant 317 is doped with a relative higher doping dosage or a relative larger gas flowing rate, and the doping dosage or the gas flowing rate of the dopant 317 are gradually reduced during the deposition process, with the doping concentration of the dopant 317 being gradually decreased with the increased thickness of the semiconductor layer 316. With these arrangements, the doping concentration of the dopant 317 is relative higher at the bottom of the semiconductor layer 316, and is relative lower at the top of the semiconductor layer 316, such that, the doping concentration of the dopant 317 in the semiconductor layer 316 illustrates a decreasing gradient trend from the bottom to the top, as shown in FIG. 6. Otherwise, in another embodiment, an undoped semiconductor layer (not shown in the drawings) may also be firstly formed on the substrate 110, and the dopant 317 with the concentration gradually increasing from top to bottom is then formed within in the undoped semiconductor layer through at least one ion implantation process.

Figures 7, 8:
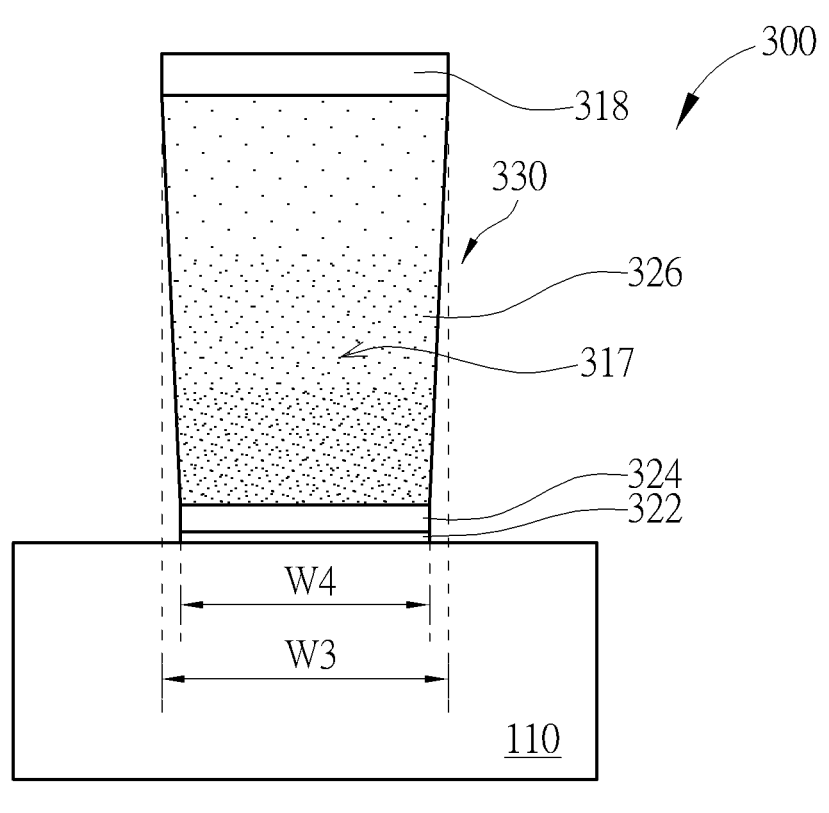

As shown in FIG. 7, a photolithography process is performed through a mask layer 318 formed on the substrate 110, to pattern the semiconductor layer 316, the dielectric layer 314, and the interface layer 312 stacked one over another as shown in FIG. 6. Accordingly, through the photolithography process, the patterns of the mask layer 318 are gradually transferred into the semiconductor layer 316, the dielectric layer 314, and the interface layer 312 stacked one over another as shown in FIG. 6, to form an interface layer 322, a gate dielectric layer 324, and a gate electrode layer 326 stacked from bottom to top on the substrate 110, to together form a gate structure 330, namely a polysilicon gate structure or an amorphous silicon gate It is noted that, while performing an etching process of the photolithography process, the gradually changing concentration of the dopant 317 will affect the etching rate of the etchant, so that, the bottom of the semiconductor layer 316 with a relatively higher doping concentration of the dopant 317 has a relatively higher etching rate related to the etchant, while the top of the with a semiconductor layer 316 relatively lower doping concentration of the dopant 317 has a relatively lower etching rate related to the etchant. With these performances, the gate structure 330 (especially for the gate electrode layer 326) of the present disclosure may therefore gain a cross-sectional profile with a larger width at top and a smaller width at bottom, thereby showing an inverted trapezoidal shape. Then, the cross-section of the gate structure 330 includes a relative larger width W3 at top and a relative smaller width W4 at bottom.

As shown in FIG. 8, after completely removing the mask layer 318, a deposition process and an etching back process are sequentially performed, to form a spacer 328 on sidewalls of the gate structure 330, with the spacer 328 including a monolayer structure or a multilayer structure. Then, a CESL (not shown in the drawings), and a ILD layer 332 are formed on the substrate 110, to cover on the spacer 328, wherein the top surface of the ILD layer 332 is coplanar with the top surface of the gate structure 330, to expose the top portion of the gate structure 330, namely exposing the gate electrode layer 326 having polysilicon or amorphous silicon material. Besides, the detailed features, fabrication and the materials of the spacer 328 and the ILD layer 332 are substantially the same as those of the spacer 128 and the ILD layer 132 of the aforementioned first embodiment, and which will not be redundantly described hereinafter.

Figure 9:
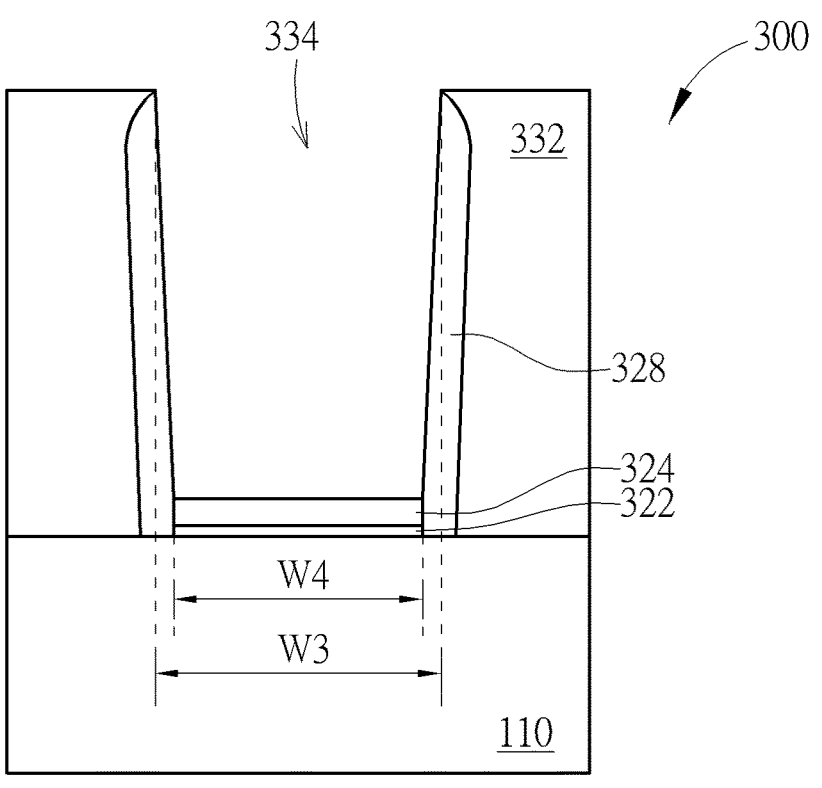

As shown in FIG. 9, a selectively dry etching process or a wet etching process is performed, for example removing the gate electrode layer 326 of the gate structure 330 by using an etchant like ammonium hydroxide or tetramethyl-ammonium hydroxide, so that, a gate trench 334 is formed in the ILD layer 332, to expose the dielectric layer 324 underneath. Since the profile of the gate trench 334 is defined by the profile of the gate electrode layer 326 having polysilicon or amorphous silicon, the cross-section of the gate trench 334 correspondingly includes an inverted trapezoidal shape. Accordingly, the cross-section of the gate trench 334 correspondingly includes a relative larger aperture at the top, for example being substantially the same as the width W3 of the gate electrode layer 326 as shown in FIG. 8, and a relative smaller aperture at the bottom, for example being substantially the same as the width W4 of the gate electrode layer 326, which is facilitated the subsequent deposition process of a work function metal material layer and/or a conductive material layer.

Figure 10:
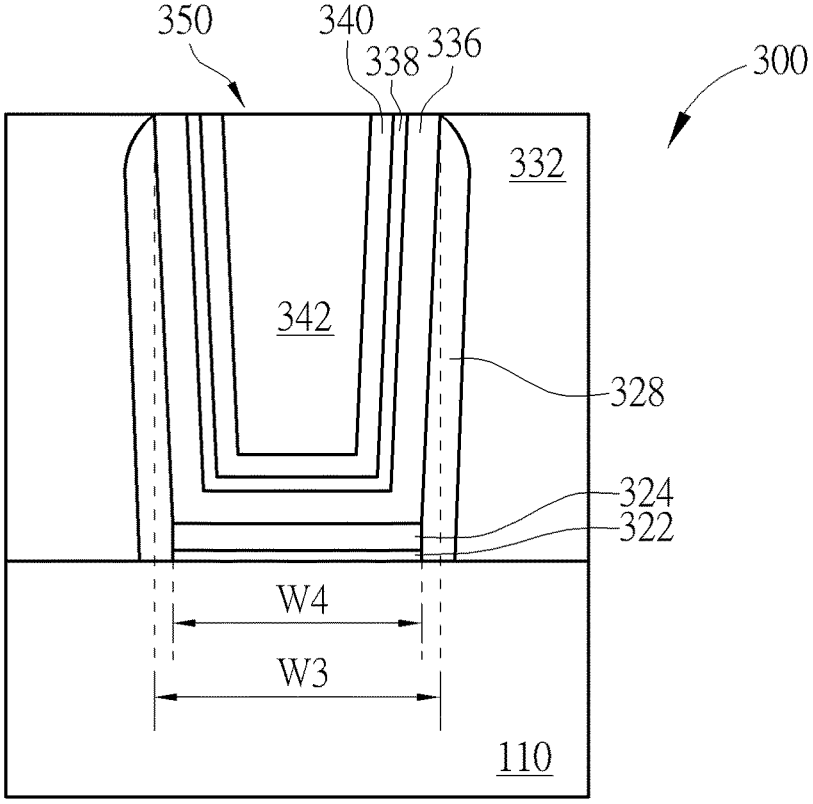

After that, as shown in FIG. 10, a bottom barrier layer 336, a work function metal layer 338, a top barrier layer 340, and a conductive layer 342 are sequentially formed in the gate trench 334 as shown in FIG. 9, to form a metal gate structure 350, wherein the top surfaces of the bottom barrier layer 336, the work function metal layer 338, the top barrier layer 340 and the conductive layer 342 are coplanar with the top surface of the ILD layer 332.

With these performances, since the cross-sectional profiles of the bottom barrier layer 336, the work function metal layer 338, the top barrier layer 340 and the conductive layer 342 are all defined by the profile of the gate trench 334 as shown in FIG. 9, as well as the profile of the gate electrode layer 326 as shown in FIG. 8, the cross-section of the metal gate structure 350 also shows an inverted trapezoidal shape. It is noted that, the bottom barrier layer 336, the work function metal layer 338, and the top barrier layer 340 respective include an U-shaped cross-section, and the conductive layer 342 fills up the rest space of the gate trench 334, without forming any seam or void. Then, the cross-section of the metal gate structure 350 also includes a relative larger width W3 at the top and a relative smaller width W4 at the bottom, as shown in FIG. 10.

Through these processes, the fabrication of the semiconductor device 300 according to the second embodiment of the present disclosure is accomplished. According to the present embodiment, the semiconductor device 300 includes the metal gate structure 350 with an inverted trapezoidal shape, in which the conductive layer 342 enables to gain a complete and compact structure, so that, the semiconductor device 300 will achieve better device reliability and efficiency by providing sufficient pressurization and stable currents. Then, the semiconductor device 300 of the present embodiment is more capable of forming logic element or high-voltage element (for example a semiconductor device with an operating voltage being higher than 20 volts).

Referring to the fabricating method of the present embodiment, a polysilicon gate structure or an amorphous silicon gate structure (namely the gate structure 330) is firstly formed, and the gate electrode layer 326 having the polysilicon or amorphous silicon material is removed and replaced by the work function metal layer 338 and the conductive layer 342 having the metal material, through the RMG process. It is noted that the gate electrode layer 326 of the present embodiment is formed by depositing the polysilicon or amorphous silicon material while introducing the dopant gas synchronously through an in-situ doping process, so as to form the dopant 317 with a gradually changing concentration to locally control the etching rate of the polysilicon or amorphous silicon material. Accordingly, the gate electrode layer 326 is therefore obtain the cross-sectional profile including a relative larger width W3 at top and a relative smaller width W4 at bottom, thereby showing an inverted trapezoidal shape. Then, the inverted trapezoidal shape is beneficial on performing the subsequent RMG process, for example facilitating the removing of the gate electrode layer 326 and/or the backfilling of the work function metal material layer or the conductive material layer.

However, in another embodiment, the metal gate structure may no longer be formed additionally, based on practical requirements. With these arrangements, the gate electrode layer 326 of the polysilicon gate structure or the amorphous silicon gate structure (namely the gate structure 330) includes the dopant with a concentration gradually increased from top to bottom, wherein the concentration of the dopant 317 in the gate electrode layer 326 is for example about 1E14 to 1E15 per cubic centimeter. For example, the concentration of the dopant 317 at the top of the gate electrode layer 326 may be about 1E14 per cubic centimeter, and the concentration of the dopant 317 at the bottom of the gate electrode layer 326 may be about 1E15 per cubic centimeter, but not limited to. Furthermore, the material selection of the dopant 317 is preferably different depending on the various conductive types of the transistor formed in the subsequent process. For example, when the dopant 317 within the gate electrode layer 326 includes the N-type dopant, the polysilicon gate structure or the amorphous silicon gate structure is more suitable for fabricating a N-type MOS transistor in the subsequent process, and when the dopant 317 within the gate electrode layer 326 includes the P-type dopant, and the polysilicon gate structure or the amorphous silicon gate structure is more suitable for fabricating a P-type MOS transistor in the subsequent process, but not limited thereto.

Additionally, people skilled in the arts should fully realized that although the aforementioned fabricating method of the present disclosure are all exemplified by firstly forming a polysilicon gate structure or an amorphous silicon gate structure and then performing a RMG process, but the fabricating method of the present disclosure is not limited thereto and may be further applied on other fabricating process. In other embodiments, the fabricating method of the present disclosure may be further applied on any fabricating process for forming a metal gate with a high dielectric constant dielectric layer, thereby improving the structural or functional defects of the metal gate caused by poor step coverage and poor gap-filling of the conductive material, and being further applied on forming any logic element or high-voltage element.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a metal gate structure disposed on the substrate, with the metal gate structure comprising an inverted trapezoidal shape, wherein the metal gate structure comprises a high-k dielectric layer in a liner shaped, and a barrier layer and a work function metal layer both in an U-shaped and disposed on the high-k dielectric layer, wherein a bottom surface of the high-k dielectric layer comprises a first width in a horizontal direction, a bottom surface of the barrier layer comprises a second width in the horizontal direction, and the second width is equal to the first width; and
a dielectric layer, disposed on the substrate, wherein the metal gate structure is disposed within the dielectric layer.

2. The semiconductor device according to claim 1, wherein the metal gate structure further comprises a conductive layer disposed on the work function metal layer.

3. The semiconductor device according to claim 1, further comprising:
a spacer, disposed on sidewalls of the metal gate structure, within the dielectric layer.

4. A semiconductor device, comprising:
a substrate;
a polysilicon gate structure disposed on the substrate, wherein the polysilicon gate structure comprises a dopant having an increasing dopant-concentration gradually increased from top to bottom, wherein a first portion of the polysilicon gate structure has the dopant in a first concentration and has a first width, a second portion of the polysilicon gate structure has the dopant in second concentration and has a second width, the first concentration is lower than the second concentration, and the first width is larger than the second width;
a dielectric layer, disposed on the substrate, wherein the polysilicon gate structure is disposed within the dielectric layer; and
a gate dielectric layer, disposed on the substrate, below the polysilicon gate structure; and
an interface layer, disposed between the gate dielectric layer and the substrate, wherein the gate dielectric layer and the interface layer both include a third width in a horizontal direction, and the third width is the same as the second width of the second portion of the polysilicon gate structure.

5. The semiconductor device according to claim 4, wherein the polysilicon gate structure comprises an inverted trapezoidal shape.

6. The semiconductor device according to claim 4, wherein the semiconductor device comprises a N-type metal-oxide semiconductor transistor, and the dopant comprises a N-type dopant.

7. The semiconductor device according to claim 4, wherein the semiconductor device comprises a P-type metal-oxide semiconductor transistor, and the dopant comprises a P-type dopant.

8. The semiconductor device according to claim 4, wherein the first concentration and the second concentration each is ranged from 1E14 to 1E15 per cubic centimeter.

9. The semiconductor device according to claim 4, further comprising:

a spacer, disposed on sidewalls of the polysilicon gate structure, within the dielectric layer.

10. A method of fabricating a semiconductor device, comprising:

providing a substrate;

forming a polysilicon gate structure on the substrate, wherein the polysilicon gate structure comprises a dopant having an increasing dopant-concentration gradually increased from top to bottom, wherein a first portion of the polysilicon gate structure has the dopant in a first concentration and has a first width, a second portion of the polysilicon gate structure has the dopant in second concentration, the first concentration is lower than the second concentration and has a second width, and an etching rate of the first portion is also lower than an etching rate of the second portion;

forming a dielectric layer on the substrate, wherein the polysilicon gate structure is formed within the dielectric layer; and forming a gate dielectric layer on the substrate, below the polysilicon gate structure; and forming an interface layer between the dielectric layer and the substrate, wherein the dielectric layer and the interface layer both include a third width in a horizontal direction, and the third width is the same as the second width of the second portion of the polysilicon gate structure.

11. The method of fabricating a semiconductor device according to claim 10, wherein forming the polysilicon gate structure further comprises:

forming a semiconductor layer on the substrate; and etching the semiconductor layer, to form the polysilicon gate structure; and forming a spacer on sidewalls of the polysilicon gate structure.

12. The method of fabricating a semiconductor device according to claim 11, wherein while forming the semiconductor layer, the dopant is in-situ doping into the semiconductor layer.

13. The method of fabricating a semiconductor device according to claim 11, wherein while forming the semiconductor layer, a dopant gas is introduced to the semiconductor layer.

14. The method of fabricating a semiconductor device according to claim 11, wherein the semiconductor layer is etched after forming the dopant in the semiconductor layer.

15. The method of fabricating a semiconductor device according to claim 10, wherein the dopant comprises an N-type dopant or a P-type dopant.

16. The method of fabricating a semiconductor device according to claim 10, wherein the polysilicon gate structure comprises an inverted trapezoidal shape.

17. The method of fabricating a semiconductor device according to claim 10, further comprising:

removing the polysilicon gate structure, to form a gate trench within the dielectric layer; and forming a metal gate structure in the gate trench.

18. The method of fabricating a semiconductor device according to claim 17, wherein the metal gate structure comprises a high-k dielectric layer, a bottom barrier layer, a work function metal layer, a top barrier layer and a conductive layer stacked from bottom to top.

19. The semiconductor device according to claim 10, wherein the semiconductor device comprises a N-type metal-oxide semiconductor transistor, and the dopant comprises a N-type dopant; or the semiconductor device comprises a P-type metal-oxide semiconductor transistor, and the dopant comprises a P-type dopant.

* * * * *